United States Patent [19]
Yudovsky et al.

[11] Patent Number: 6,146,463
[45] Date of Patent: Nov. 14, 2000

[54] APPARATUS AND METHOD FOR ALIGNING A SUBSTRATE ON A SUPPORT MEMBER

[75] Inventors: Joseph Yudovsky, Palo Alto; Kenneth Tsai, Redwood City; Ilya Perlov; Eugene Gantvarg, both of Santa Clara, all of Calif.

[73] Assignee: Applied Materials, Inc., Santa Clara, Calif.

[21] Appl. No.: 09/097,006

[22] Filed: Jun. 12, 1998

[51] Int. Cl.⁷ .................................................. C23C 16/00
[52] U.S. Cl. ............................................ 118/729; 118/728
[58] Field of Search ................................. 118/728, 729; 29/464

[56] References Cited

U.S. PATENT DOCUMENTS

| | | | |
|---|---|---|---|
| 5,695,568 | 12/1997 | Sinha et al. | 118/728 |
| 5,820,685 | 10/1998 | Kurihara et al. | 118/729 |
| 5,848,670 | 12/1998 | Salzman | 118/729 |
| 5,860,640 | 1/1999 | Marohl et al. | 118/729 |

*Primary Examiner*—Shrive Beck
*Assistant Examiner*—S. R. MacArthur
*Attorney, Agent, or Firm*—McDermott, Will & Emery

[57] ABSTRACT

A method and arrangement for lifting lowering and centering a substrate on a surface employs lift pins have conical tips. A capture range is provided by the conical tips to capture and center misaligned wafers. One or more of the pins are inclined in certain embodiments to enhance the alignment capability of the lift pins. The inclined lift pins, when retracting into a support member at an angle, move a supported substrate horizontally into proper alignment.

8 Claims, 6 Drawing Sheets

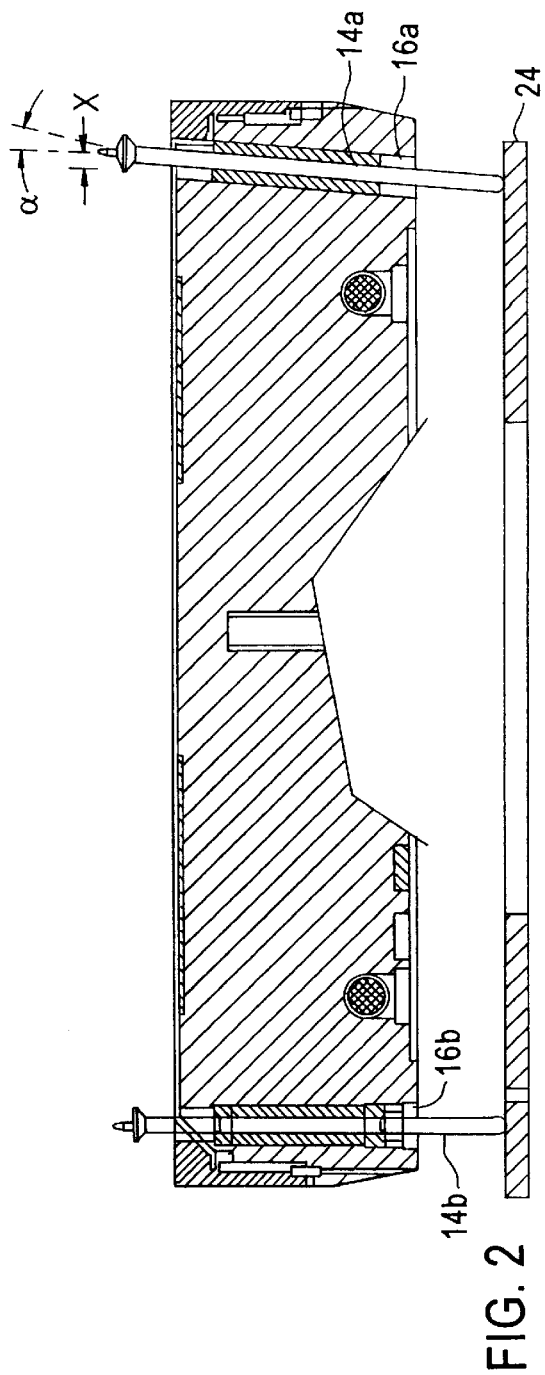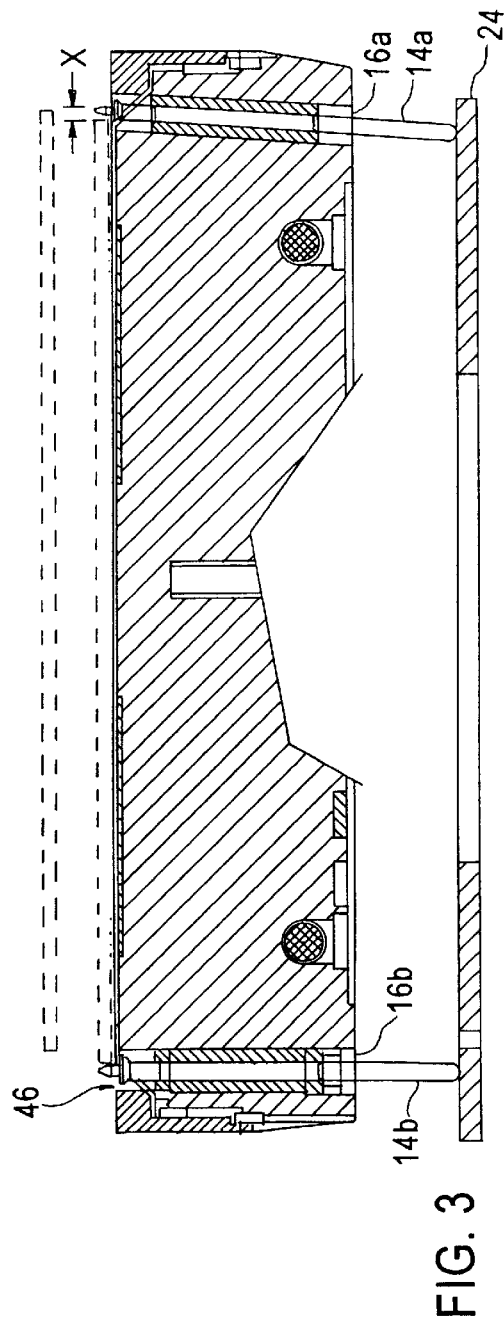

APPARATUS AND METHOD FOR ALIGNING A SUBSTRATE ON A SUPPORT MEMBER

FIELD OF THE INVENTION

The present invention relates to the field of semiconductor substrate processing equipment. More particularly, the present invention relates to an apparatus and method for aligning a workpiece, such as on a support member.

BACKGROUND OF THE RELATED ART

In the fabrication of integrated circuits, equipment has been developed to automate substrate processing by performing several sequences of processing steps without removing the substrate from a vacuum environment, thereby reducing transfer times and contamination of substrates. Such a system has been disclosed for example by Maydan et al., U.S. Pat. No. 4,951,601, in which a plurality of processing chambers are connected to a transfer chamber. A robot in a central transfer chamber passes substrates through slit valves in the various connected processing chambers and retrieves them after processing in the chambers is complete.

The processing steps carried out in the vacuum chambers typically require the deposition or etching of multiple metal, dielectric and semiconductor film layers on the surface of a substrate. Examples of such processes include chemical vapor deposition (CVD), physical vapor deposition (PVD), and etching processes. Although the present invention pertains primarily to CVD processes, it may have application to other processes as well.

CVD vacuum chambers are employed to deposit thin films on semiconductor substrates. Typically, a precursor gas is charged to a vacuum chamber through a gas manifold plate situated above a substrate. The substrate is heated to process temperatures. The precursor gas reacts on the heated substrate surface to deposit a thin layer of material thereon. In a typical process chamber, a support member on which a substrate is mounted during processing is movable vertically in the chamber by means of a vertically movable support member. A plurality of lift pins are also vertically movable by an elevator and extend through the support member to facilitate transfer to the substrate from a robot blade onto the support member.

A number of problems associated with the deposition of the film or material on the substrate are at least partially attributed to improper alignment and shielding of the substrate. One such related problem occurs when the material deposits on the edge and back side surfaces of the substrate. Typically, these edge and back side surfaces are rougher than the highly polished top surface and are not coated with the adhesive layer covering the top surface. Therefore, material deposited on these surfaces tends to flake off the substrate and create particles. Generation of particles within the chamber is to be avoided as the particles may contaminate the substrates being processed and, thereby reduce the yield of good devices, and may damage the chamber components. Another problem occurs when the material deposits on the back side of the substrate causing the substrate to stick to the support member. Sticking may lead to particle generation when the deposited material adhering the substrate to the support member is broken away during removal of the substrate from the chamber.

An additional concern relating to the alignment and shielding pertains to the industry demands for film uniformity and edge exclusion. As the desire for greater throughput and efficiency has increased, the standards governing the placement and thickness of the deposited film at the substrate edge have continually become more stringent. Ideally, the deposited film has a uniform thickness across the entire area of the substrate with the edges of the film dropping off rapidly so that the zone of exclusion has little or no deposition thereon. Further, there is ideally no deposition on the beveled edges of the substrate. Industry practice has moved toward this ideal goal so that the current industry standards demand no film deposition on the beveled edge of the substrate and a film thickness at a point 3 mm from the edge of the substrate that is 90 percent or more of the film thickness at the center of the substrate with a thickness uniformity of less than 3 percent, excluding the area within 1 mm from the substrate edge. To achieve these requirements, the substrate must be properly aligned on the support member with the edges properly shielded.

In an effort to overcome the abovementioned problems, various devices and methods have been developed to shield the edge and back side surfaces of the substrate and to provide proper alignment of the substrate relative to the support member and other chamber components. Included among these devices are shadow rings, shielding purge gases and their delivery systems, and alignment mechanisms, such as guide pins. Shadow rings and purge gases are used to prevent deposition of the material on the edge and back side surfaces of the substrate; whereas, guide pins have been used to align the substrate on the support member.

The shielding purge gas is directed about the periphery of the substrate and exerts a positive pressure that reduces the chance that processing gas will reach the edge and back side surfaces of the substrate. To provide the purge gas to the full periphery of the substrate, the support member typically includes an annular gas groove that has an inner diameter that is less than the outer diameter of the substrate and an outer diameter that is greater than the outer diameter of the substrate so that a properly aligned substrate resting on the upper surface of the substrate overhangs the gas groove about the fill periphery of the substrate. It has been found that the combination of a shadow ring and a purge gas further enhances edge performance.

As depicted schematically in FIGS. 11 and 12, one type of alignment mechanism employs a plurality of guide pins 90 extending upwardly from the upper surface of the support member 92. The guide pins 90 are equally spaced about the periphery of the support member 92 and have an inner angled surface that flares outwardly toward their upper ends. The guide pins 90 are sufficiently spaced so that they can receive a substrate therebetween. The guide pins 90 act as a funnel that centers the substrate on the support member 92 as the support member 92 moves to receive the substrate thereon. So that the substrate is properly positioned with its full peripheral edge overhanging the gas groove 94, the guide pins 90 extend from the outer periphery of the gas groove 94 and partially overhang the gas groove 94. In this way, the lower end of the funnel defined by the plurality of guide pins 90 has a diameter that is intermediate the inner and outer diameters of the gas groove 94 and that is larger than the outer diameter of the substrate. Accordingly, as the support member 92 moves upwardly to receive the substrate thereon, the angled walls of the guide pins 90 force the substrate laterally into alignment and so that it overhangs the gas groove 94 about the full periphery of the substrate.

However, the guide pins 90 used to force the substrate laterally into alignment necessarily abut the edge of the substrate to obtain this alignment and remain in abutment therewith when the substrate rests upon the upper surface of the support member 92. The purge gas flowing from the gas groove 94 cannot flow between the guide pins 90, which are attached to the upper surface of the support member 92, and the substrate when the substrate and guide pins 90 are in abutment with one another. Therefore, the contact between the guide pins 90 and the substrate prevents the purge gas from shielding the edge of the substrate proximal the guide pins 90 in abutment with the substrate and permits deposition of the film in the vicinity of the abutting guide pins 90. Thus, the blockage caused by contact between the guide pins 90 and the substrate edge allows the film to deposit in the exclusionary zone and on the beveled edge near the guide pins 90 creating a danger of flaking and particle generation and preventing compliance with the industry requirements for edge exclusion. Furthermore, the lift pins 96 employed to lift the wafer from the surface of the support member are typically located radially interior to the gas groove 94. This requires more complicated routing of gas channels in the surface of the support member 92. Hence, the prior art arrangement uses different sets of pins, as depicted in the top view of FIG. 12, to provide the separate functions of lifting the substrate and centering the substrate. This complicates the arrangement and increases the costs of the arrangement.

Thus, despite the use of all the prior art features, there remains a need for increasing proper alignment between a substrate, a support member, and a shadow ring. Additionally, there is a need for an alignment mechanism that does not adversely affect the flow of purge gas at the substrate edge, nor require routing around lift pins on the surface of the support member.

SUMMARY OF THE INVENTION

These and other needs are met by embodiments of the present invention which provide an arrangement for raising, lowering and horizontally positioning a workpiece with respect to a surface. A plurality of pins are provided, with each pin having a substantially horizontal workpiece support surface that extends radially from the pin, and a post that extends vertically from the workpiece support surface. The post forms one end of the pin. A plurality of pin guides are spaced from one another. Each of these pin guides is configured to receive and guide one of the pins substantially vertically. At least one of these pin guides is angled to guide one of the pins at a non-zero angle with respect to vertical. A lift mechanism is coupled to the pins to raise and lower the pins through the pin guides. In certain embodiments of the invention, a support member is provided onto which the workpiece is lowered and positioned by the lift pins and on which the workpiece is supported during processing of the workpiece. The pin guides are formed within the support member.

The guidance of at least one of the pins at a non-zero angle with respect to vertical allows alignment to be performed during the lowering of the workpiece to the support member. When the pins are extended, the distance between the distal end of the at least one pin that is angled from the distal ends of the remaining lift pins is greater than when the pins are retracted into the pin guides. As the pins are lowered, with at least one of the pins being inclined, the distance between the pins is reduced. If a workpiece being supported by the pins is misaligned, the inclined pin will move the misaligned workpiece back into alignment as the pins are retracted.

The earlier stated needs are also met by another aspect of the present invention which provides a workpiece processing apparatus comprising a chamber in which the processing of the workpiece is performed. A support member in the chamber supports the workpiece during the processing of the workpiece. Pins are provided that receive a workpiece above the support member and lower and simultaneously center a workpiece on the support member. The workpiece processing apparatus, which is a chemical vapor deposition (CVD) apparatus, for example, may be used to process a workpiece such as a semiconductor wafer substrate. In such instances, it is often vital to precisely align the workpiece on the support member. The use of pins that receive the workpiece, and lower and simultaneously center the workpiece on the support member, eliminates the need for both lift pins and guide pins. Instead, the lifting and guiding functions normally provided by separate sets of pins are combined into a single set of pins. The pins can be either inclined or all guided vertically with respect to the workpiece, according to different embodiments of the invention. The configuration of the pins is taken advantage of to align the workpiece when the pins are guided vertically, in accordance with an embodiment of the present invention.

In another aspect of the present invention, a method of centering a workpiece on a support member is provided in which the workpiece is received on a plurality of pins that are extended above the support member. The pins are lowered to lower the workpiece onto the support member, with at least one of these pins being inclined at a non-zero angle with respect to vertical. The workpiece is moved horizontally with the pins during the step of lowering the pins, to there by center the workpiece on the support member. According to this aspect of the present invention, the workpiece is moved horizontally by the pins merely by the action of lowering the pins, so that the centering and lowering functions are accomplished simultaneously and may be performed by a single set of pins.

According to another aspect of the present invention, a lift pin for wafer processing apparatus is provided with an elongate portion and a wafer support section at one end of the elongate portion. The wafer support section has a substantially horizontal wafer support surface that extends circumferentially from the elongate portion. The cone extends vertically from this wafer support section.

The lift pin of the present invention provides alignment of a workpiece as the shape of the cone is advantageously employed to provide a capture range to capture misaligned wafers. Hence, a wafer received on the cones of a plurality of pins may be misaligned, but upon sliding down the cones to the wafer support section, the wafer will be moved horizontally and into proper alignment. This feature is useful in embodiments which employ all vertical lift pins, all inclined lift pins, or a combination of vertical and inclined lift pins.

The earlier stated needs are also met by an embodiment of the present invention which provides an arrangement for horizontally positioning a workpiece on a surface. The arrangement includes a plurality of pins arranged to receive a workpiece at first pin ends and lower and raise the workpiece to and from the surface. Guides are configured to receive and guide movement of the pins so that in a receiving position in which the pins receive the workpiece, the first pins ends are separated from one another in the horizontal plane to define a first perimeter. In a delivery position in which the workpiece is on the surface, the first pin ends are separated from one another in the horizontal plane define a second perimeter that is smaller than the first perimeter. Since the separation of the pin ends from one another becomes smaller when the workpiece is in a delivery position on the surface, an initially misaligned workpiece will become aligned when the pins are moved from the receiving position to the delivery position.

The foregoing and other features, aspects and advantages of the present invention will become apparent from the following detailed description of the present invention when taken in conjunction with the accompanying drawings.

BRIEF DESCRIPTION OF THE DRAWINGS

FIG. 2 is a side view of a support member and lift pins constructed in accordance with an embodiment of the present invention depicting the pins in an extended position.

FIG. 3 is a side view of a support member and lift pins constructed in accordance with an embodiment of the present invention depicting the pins in a retracted position.

DETAILED DESCRIPTION OF EXEMPLARY EMBODIMENTS

The present invention provides an alignment arrangement for aligning a substrate 20 relative to a support member 12 in a process chamber 10. The alignment apparatus as described herein is particularly useful in CVD (chemical vapor deposition) processing chambers and the following description refers primarily to the CVD processes to facilitate description and understanding. However, it is understood that the present invention may have application to other processes, process chambers, and apparatus, such as PVD and etch processes, and is therefore not limited to the precise form described.

Figure 1:
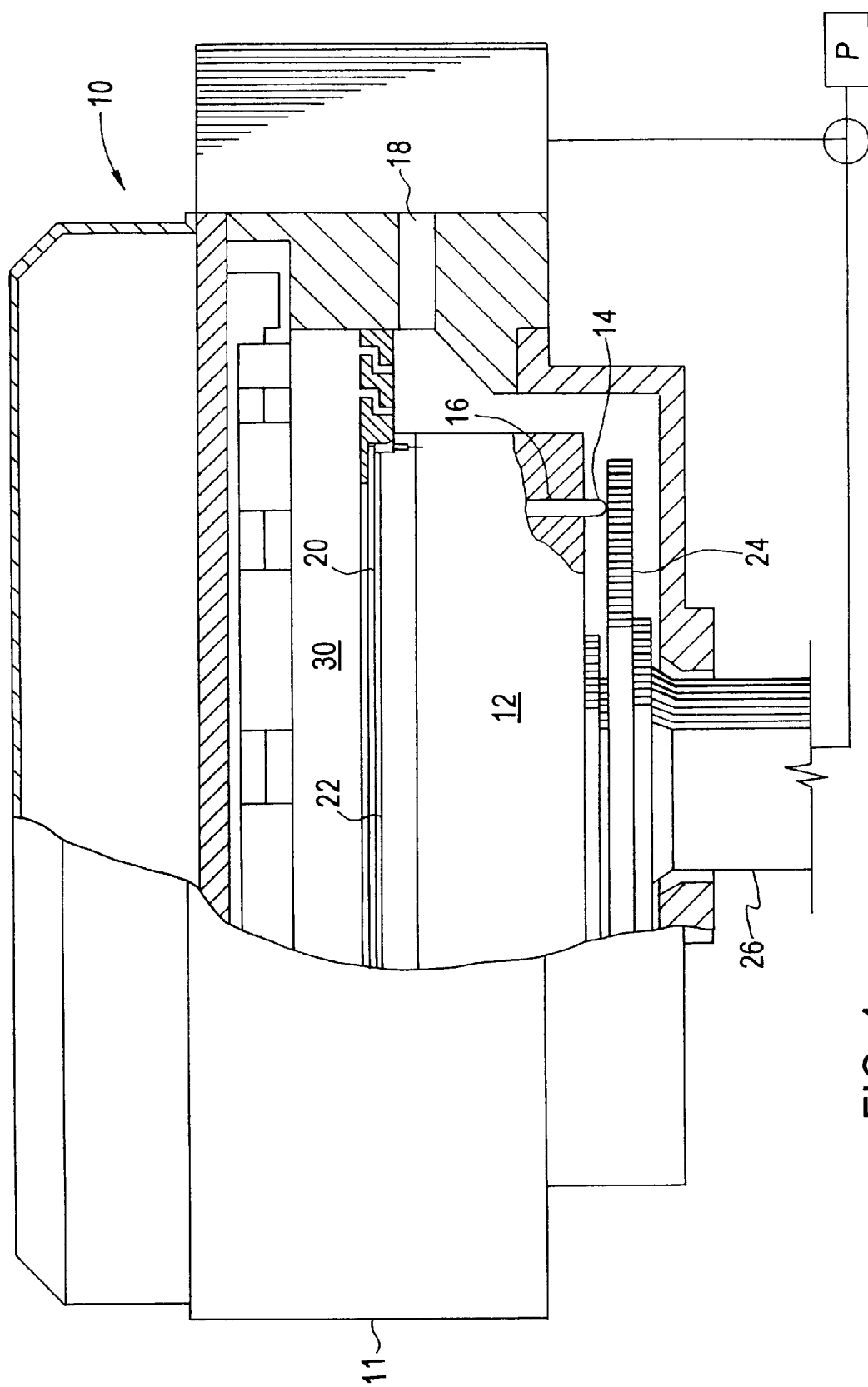
FIG. 1 is a partial cross-sectional side elevational view of a process chamber constructed in accordance with an embodiment of the present invention.

FIG. 1 shows a typical process chamber 10 defined by an outer body 11. The chamber 10 may be part of a vacuum processing system having a plurality of process chambers 10 connected to a central transfer chamber. The process chamber 10 houses a support member 12 that may take the form of a pedestal or susceptor mounted on a generally vertically oriented shaft 26. The support member 12 serves to support a substrate 20 on its flat upper surface 22. The support member 12 has a number of lift pins 14 disposed between pin guides 16. Only a single pin 14 and pin guide 16 are depicted in FIG. 1 for illustration purposes. The lift pins 14 of the present invention support the substrate 20 during substrate exchange with the robot. As will be described, the lift pins 14 of the present invention also center the substrate 20 on the support member 12. The lift pins 14 lift the substrate 20 clear of the upper surface 22 of the support member 12 after the processing period. The removal of the substrate 20 is achieved by a conventional process chamber robot arm (not shown) which enters the process chamber 10 through a slit valve opening 18. The same robot arm is also used to insert the substrate 20 into the process chamber 10. The lift pins 14 are movable substantially vertically under action of a lift mechanism of which only the lift ring 24 is depicted in FIG. 1 between a receiving position in which the lift pins 14 receive the substrate 20 and a delivery position in which the substrate 20 is on the surface of the support member 12.

Typically, the support member 12 comprises a block of metal, e.g., aluminum, that has a single coil resistance heater embedded therein. However, the support member 12 may be formed of other materials such as ceramic. In order to provide uniform heating of the support member 12 and to uniformly heat the substrate 20 mounted thereon, the coil must be in contact with the bulk of the support member 12 on all sides. Alternatively, the support member 12 may include cooling channels to cool some region of substrate 20 to improve temperature uniformity. A motion actuator (not shown) interconnected to the shaft 26 of the support member 12 is adapted to move the support member 12 vertically within the process chamber 10 alternatively, between a first, lowered position, and a second, raised position where a process step is performed.

FIG. 2 is a side view of an embodiment of a support member 12 having a single inclined pin guide. The remaining components of the process chamber are not depicted in FIG. 2. In the embodiment of FIG. 2, a single pin guide 16a is inclined from the vertical by an angle $\alpha$ of approximately 3°. This causes the lift pin 14a that is guided within the pin guide 16a to be also inclined at an angle $\alpha$ of approximately 3°. This pin 14a will henceforth be referred to as an inclined pin. In this embodiment the remaining pin guides 16b are vertical so that lift pins 14b are guided vertically as they extend from and retract into the support member 12. A second vertical lift pin 14b and pin guide 16b are provided in this embodiment, but is not depicted in FIG. 2. An exemplary arrangement of the lift pins 14a–14b is provided in a top view of the support member 12 of FIG. 4.

Referring back to FIG. 2, the inclined lift pin 14a and the vertical lift pins 14b are shown in their extended positions in which a substrate 20 is captured during transfer of the substrate 20 from a robot arm (not shown). When in the extended position, lift pins 14a and 14b have their distal ends separated from one another by a distance slightly larger than the diameter of the substrate 20. This difference between the distance separating the distal ends of the lift pins 14a and 14b and the diameter of the wafer is provided with reference numeral X in FIG. 2 and is referred to as the capture range. In an exemplary embodiment in which the wafer diameter is approximately 7.882" in diameter at 475° C., the capture range is approximately 0.057". This assumes that the angle of inclination $\alpha$ of the inclined pin 14a is approximately 3° and that the lift pins 14a and 14b have been extended approximately 0.660" from the top surface 22 of the support member 12.

The capture range provided in the embodiment of FIG. 2 due to the inclination of one of the lift pins 14a through the angling of a pin guide 16a provides a number of advantages. A relatively inexpensive robot mechanism that is not as precise as more expensive robot mechanisms may be used to carry the substrate into the chamber 10 and exchange it with the lift pins 14a, 14b. Furthermore, since the lift pins 14a, 14b perform the function of centering the substrate 20 onto the top surface 22 of the support member 12 in precise alignment within the workpiece area 44, separate sets of lift pins and guide pins are unnecessary. Additionally, the lift pins 14a, 14b may be positioned outside of the workpiece area 44 so that the gas grooves within the workpiece area 44 do not have to be routed around the lift pins 14a, 14b, as in the prior art.

Figure 4:
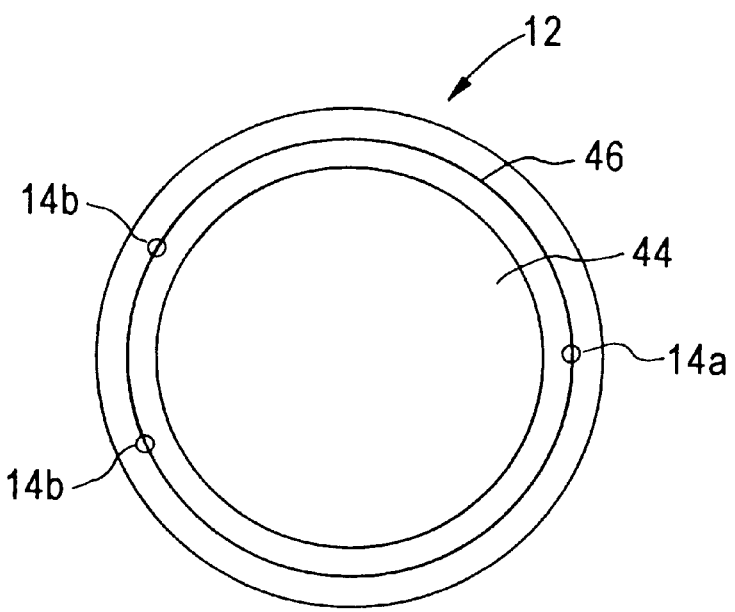
FIG. 4 is a top view of a support member constructed in accordance with an embodiment of the present invention.

FIG. 3 is a side view of the support member 12 with the lift pins 14a, 14b in a retracted position. As made apparent by this figure, a misaligned substrate 20 (shown in phantom) has been horizontally positioned (e.g. centered) upon the retraction of the lift pin 14a, 14b into their respective pin guides 16a, 16b. In preferred embodiments, the horizontal positioning of the substrate 20 causes the substrate 20 to be centered on the support member 12 within a ring groove 46. When correctly positioned within the workpiece area 44, the edges of the substrate 20 will be entirely within the ring groove 46 as seen in FIG. 4 (i.e. partially overhang) so that the purged gas may properly flow over the edge of the substrate 20 during substrate processing.

The angle of inclination $\alpha$ of the inclined lift pin 14a is approximately 3° in the embodiment of FIG. 2. However, the angle from vertical may range from approximately 1° to approximately 10° to provide the alignment advantages of the invention. In addition to the inclined orientation of the inclined lift pin 14a, the horizontal positioning of the substrate 20 is further enhanced by the design of the lift pin 14a, 14b themselves. This will be described in more detail with respect to the embodiments of FIG. 6 and the pins of FIGS. 7–10.

Figure 5:
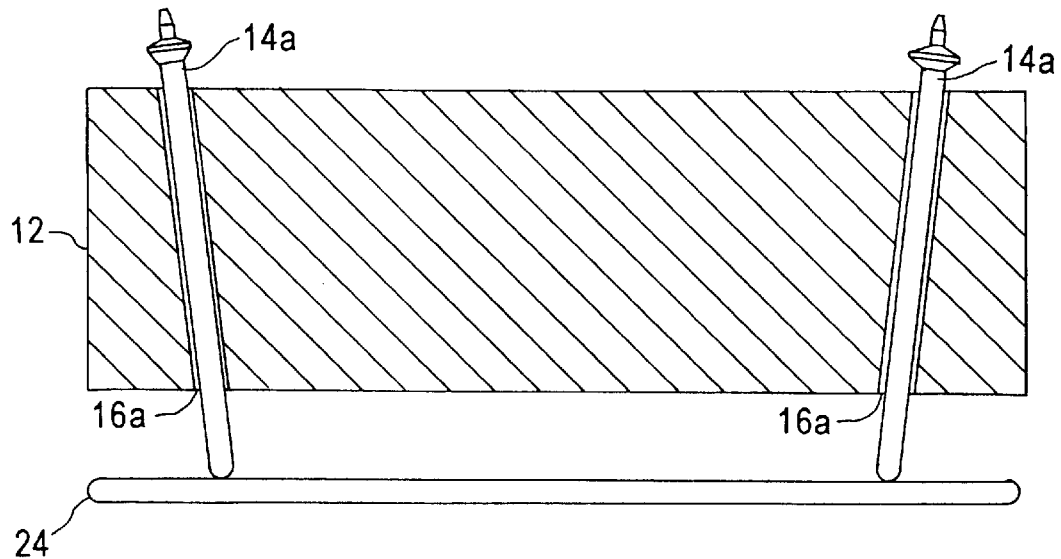
FIG. 5 is a side cross-sectional view of a support member and lift pins constructed in accordance with another embodiment of the present invention.

In an alternate embodiment of the present invention, depicted in FIG. 5, a plurality of the lift pins 14a are guided at an inclined angle by their angled pin guides 16a. For example, all three pin guides 16a may be angled so that all of the pins 14a will be inclined when they are extended. While this embodiment provides a larger potential capture range for a given angle of inclination of the lift pins 14a, the embodiment of FIG. 2 is presently preferred since only a single axis of uncertainty is present. In other words, upon lifting up the substrate 20 by the lift pins 14a for retrieval by the robot arm, the substrate 20 may only move along one axis of the embodiment of FIG. 2 since only one of the pins is inclined. By contrast, in the embodiment of FIG. 5 the substrate 20 may move in any horizontal direction during the lifting process. This makes the exchange with the robot arm potentially more difficult. However, the embodiment of FIG. 5 is still useful in centering a workpiece on a support member since it performs the centering and the lifting functions without the need for separate guide pins.

Figure 10A:
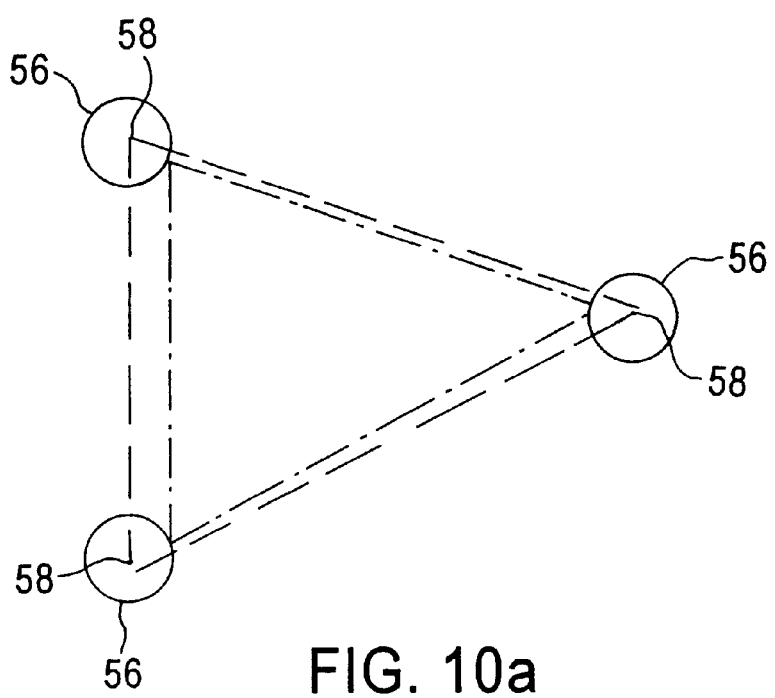
FIG. 10a is a top schematic view of a pin arrangement.
Figure 6:
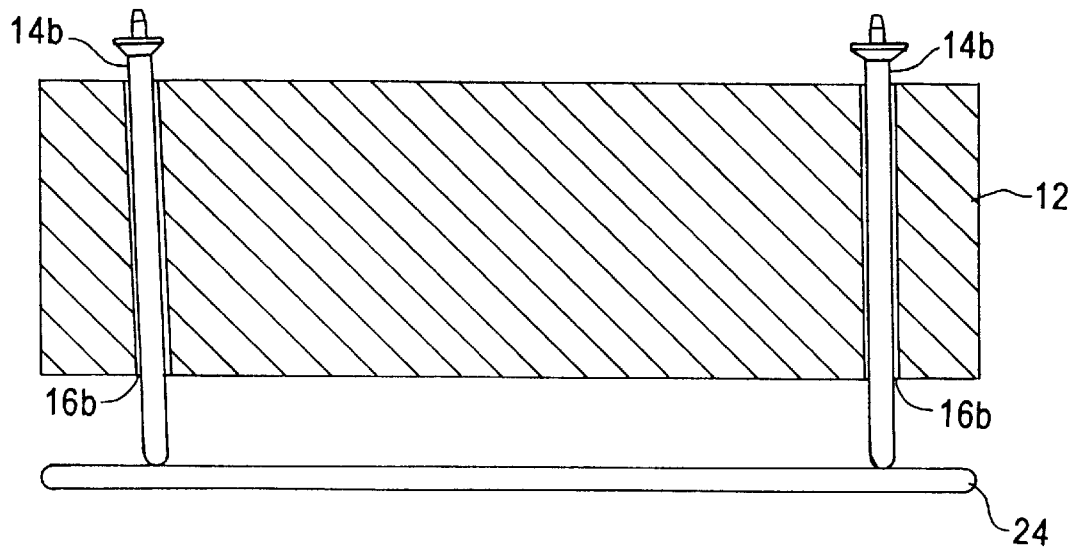
FIG. 6 is a side cross-sectional view of a support member and lift pins constructed in accordance with a further embodiment of the present invention.
Figure 7:
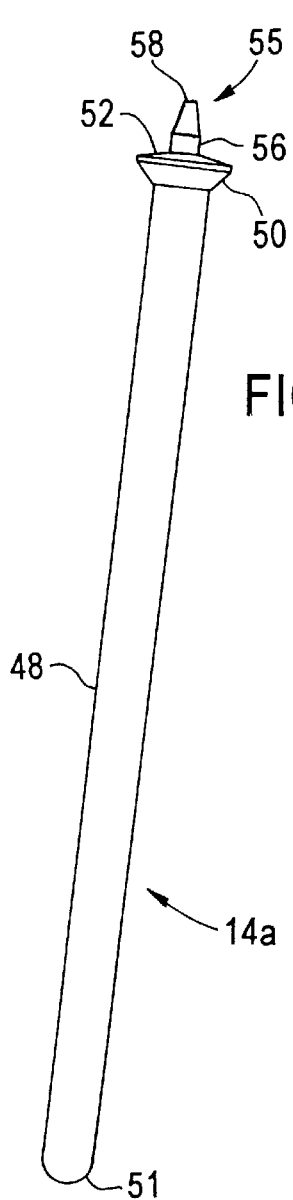
FIG. 7 depicts an embodiment of a lift pin in accordance with the present invention to be used in an inclined pin guide.
Figure 9:
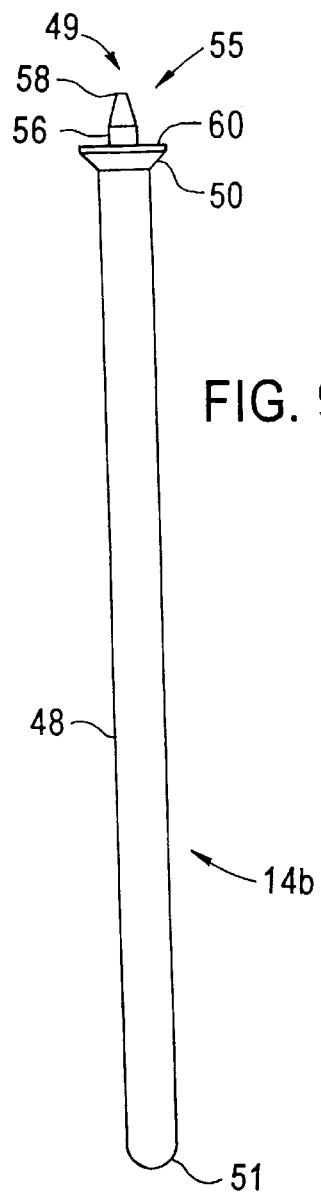
FIG. 9 depicts a lift pin constructed in accordance with the embodiment of the present invention that is to be guided vertically.
Figure 8:
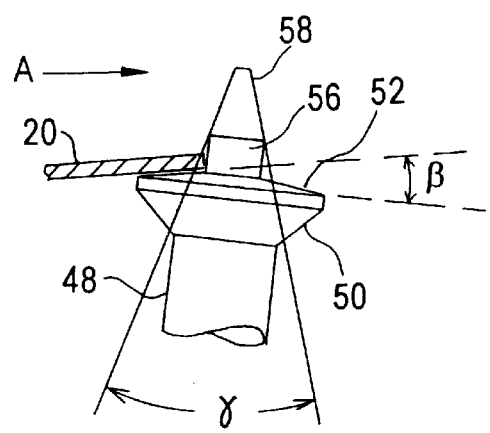
FIG. 8 is an enlarged view of one end of the lift pin of FIG. 7.
Figure 10:
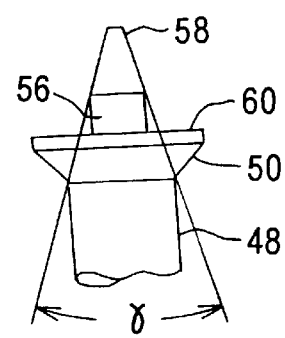
FIG. 10 is an enlarged view of one end of the lift pin of FIG. 9.
Figure 11:
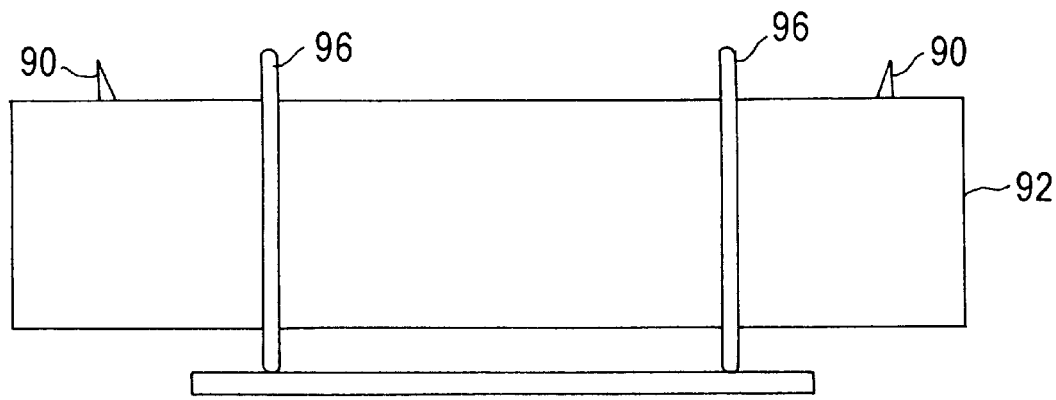
FIG. 11 is a schematic cross-sectional view of a prior art support member, lift pin and guide pin arrangement.
Figure 12:
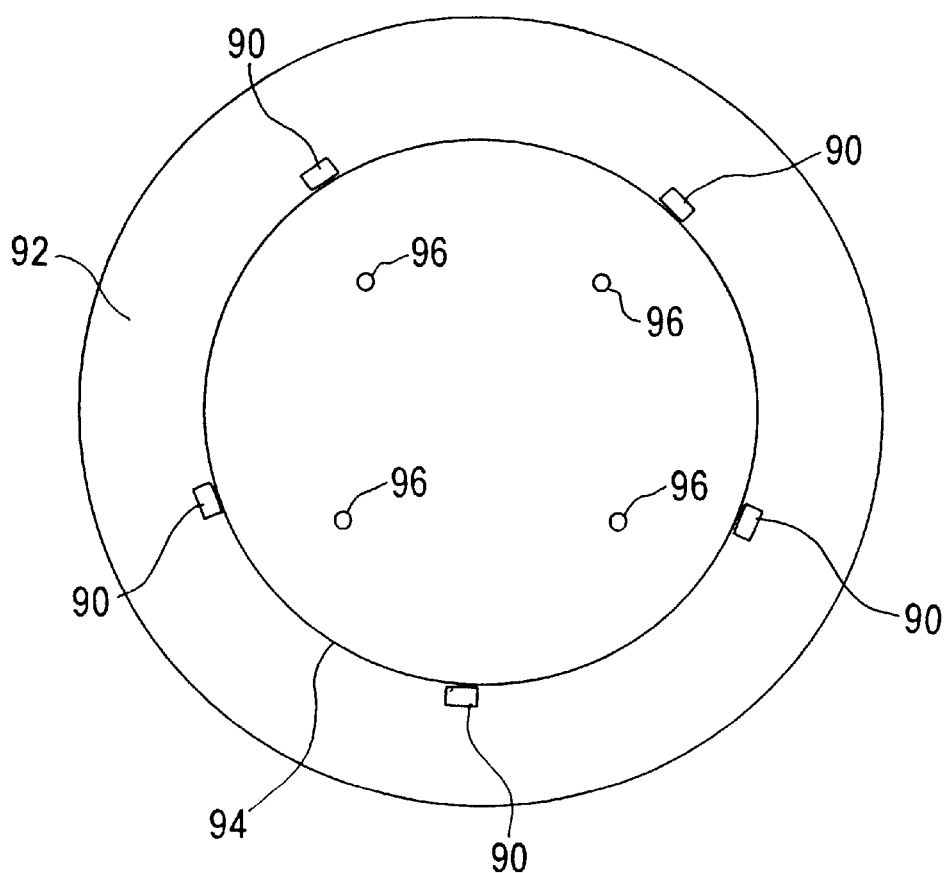
FIG. 12 is a schematic top view of the prior art arrangement of FIG. 11.

FIG. 6 depicts a further embodiment of the present invention in which none of the pins are inclined at an angle with respect to vertical. In this case, all three (or more) pin guides 16b are substantially vertical so that they have a zero angle of inclination with respect to vertical. The lift pins 14b are therefore guided in a substantially vertical fashion by the pin guides 16b as will be made clear by the following description and reference to FIGS. 9 and 10. As with the earlier described embodiments of FIGS. 2 and 5, it is desired that the lift pins 14b capture a misaligned substrate 20 during an exchange with a robot arm. Since the relative distances between the pins remains invariant during retraction and extension on the pins 14b, in the embodiment of FIG. 6, another arrangement for providing a capture range is required. This is accomplished through the shape of the vertical lift pins 14b, as depicted in FIGS. 9 and 10. Each vertical lift pin 14b has an elongate portion 48 with a first, distal end 49 forming the substrate receiving end. The second end 51 contacts the lift ring 24 so that the vertical lift pin 14b is lifted up and down by movement of the lift ring 24.

At the distal end 49 of the elongate rod 48, a wafer support section 50 is provided. The wafer support section 50, for each of the vertical lift pins in FIG. 6, as well as the vertical lift pins 14b used in the embodiment of FIG. 2, have a flat workpiece support surface 60 on the top of the wafer support section 50. A substrate 20 is supported at its edge on the workpiece support surface 60.

A cone 55 is provided at the distal end 49 of the vertical lift pin 14b and extends vertically from the workpiece support section 50. The cone 55 has a cone tip 58 and base section 56 connected at the workpiece support section 50. The tip of the cone 55 is conically shaped and may generally have an angle of between 0° and approximately 90°. However, it is preferred that the angle $\gamma$ formed by the sides of the cone tip section 58 is between approximately 25° to approximately 40°.

The shape of the cones 55 is such that the diameter of the cones at the tips 55 is less than the diameter of the cones 55 at the bases 56. Hence, the distance between the tips 58 of two vertical lift pins 14b will be greater than the distance between the bases 56 of those pins. As can be seen in a top view of the pins in FIG. 10a, in a single horizontal plane, the perimeter defined by the tips 58 of the cones 55 is larger than the diameter defined by the bases 56. Accordingly, the lift pins 14b, even when all vertically arranged as in the embodiment of FIG. 6, has a capture range which allows a misaligned wafer or substrate 20 to be captured within the tips 58 of the cones 14b. After capture, the substrate 20 will then become horizontally positioned (e.g. centered) by sliding down the cones 55 to rest against the base sections 56 and on the flat horizontal workpiece support surface 60 of the workpiece support section 50.

An exemplary embodiment of the inclined lift pins 14a, used in the embodiments of FIGS. 2 and 5, shares many of the same features with the vertical lift pins of FIGS. 9 and 10. For example, each inclined lift pin 14a has an elongate section 48, a workpiece support section 50, and a cone 55 with a tip 58 and base section 56. As with the vertical lift pins 14b, the inclined lift pin 14a also has the sides of the cone tip 58 angled between 0 and 90° angle with a preferred range of between about 25° and 40°. Unlike the vertical lift pins 14b, however, the inclined lift pin 14a has either an angle or curved workpiece support surface 52 at the workpiece support section 50. In the preferred embodiment in which the workpiece support surface 52 is flat, the surface 52 is angled at an angle $\beta$ that is at least as much as the angle of inclination $\alpha$ of the pin guide 16a (and therefore the angle of inclination of the pin 14a). As an example, if the pin guide 16a is angled at approximately 3°, the angle $\beta$ of the workpiece support section with respect to the center axis of the inclined work pin 14a is at least equal to 3°. It is preferred that the angle of inclination $\beta$ workpiece support surface 52 be between approximately 2° and 5°. The workpiece support section 52 can also be angled at an angle greater than the angle of inclination $\alpha$.

One reason for the angling of the workpiece support surface 52 of inclined lift pin 14a is to provide a flat support surface for the substrate 20 at that lift pin 14a. If a vertical lift pin of FIG. 9 with a flat workpiece support surface 60 were used instead of the inclined lift pin of FIG. 8 in an angled pin guide 16a, then only one edge of the workpiece support surface 60 would contact the substrate 20. This would cause mechanical stresses on the substrate 20.

Although it is advantageous to provide a larger effective support surface for the substrate 20, this also has a slight disadvantage in that the inclined lift pin 14b will tend to pull a substrate 20 in the direction of arrow A so that the once-aligned substrate 20 will again become misaligned upon the extension of the lift pins 14a, 14b. To overcome this concern, the angle β may be made greater than the angle of inclination α so that the substrate 20 does not rest flatly on the workpiece support section 52, but rather at a slight angle to the workpiece support section 52. Alternatively, instead of a flat workpiece section 52, a slight curve in the surface may be provided to prevent two flat surfaces from being in intimate contact with each other. In certain embodiments of the invention, the workpiece support section 52 is made of a material having a very low coefficient friction so that the substrate 20 will slide easily on the workpiece support surface 52.

The lift pins 14a, 14b may be made of any suitable material, taking into account the specific conditions the lift pins 14a, 14b will be exposed to within the process chamber 10. It is desirable that the pins be non-reactive with the processes taking place within the chamber 10. Ceramic materials such as alumina are suitable for many processes such as chemical vapor deposition.

The embodiments of the present invention provide methods and arrangements that use a single set of pins to both center and lift and raise a substrate, such as that of semiconductor wafer. This is accomplished by inclining one or more of the lift pins and/or configuring the lift pins with conical tips so that misaligned substrates will be misaligned when placed on the tips.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A workpiece processing apparatus comprising:
   a chamber in which processing of a workpiece is performed;
   a support member in the chamber that supports a workpiece during processing of a workpiece; and
   pins movable relative to the support member that receive a workpiece above the support member and lower and simultaneously center a workpiece on the support member.

2. The apparatus of claim 1, further comprising guides that receive and guide the pins substantially vertically, with at least one of the guides being angled at a non-zero angle with respect to the vertical such that the pin guided by the angled guide is inclined at a non-zero angle with respect to the vertical when the pin is extended from the angled guide.

3. The apparatus of claim 2, wherein a plurality of the guides are angled at a non-zero angle with respect to the vertical.

4. The apparatus of claim 1, further comprising a lift mechanism coupled to the pins to raise and lower the pins through the pin guides.

5. The apparatus of claim 1, wherein each pin includes: an elongate portion; a workpiece support section at one end of the elongate portion, the workpiece support section having a substantially horizontal workpiece support surface extending circumferentially from the elongate portion; and a cone extending vertically from the wafer support section.

6. The apparatus of claim 5, wherein the elongate portions of the cones have conical tips such that a distal end of the cones of the pins define a a capture range.

7. The apparatus of claim 2, wherein the non-zero angle is between approximately 1 degree and approximately 10 degrees.

8. The apparatus of claim 2, wherein the non-zero angle is between approximately 2 degrees and approximately 4 degrees.

\* \* \* \* \*